United States Patent
Chittipeddi et al.

(10) Patent No.: US 6,313,025 B1
(45) Date of Patent: Nov. 6, 2001

(54) PROCESS FOR MANUFACTURING AN INTEGRATED CIRCUIT INCLUDING A DUAL-DAMASCENE STRUCTURE AND AN INTEGRATED CIRCUIT

(75) Inventors: Sailesh Chittipeddi, Allentown, PA (US); Sailesh Mansinh Merchant, Orlando, FL (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/385,165

(22) Filed: Aug. 30, 1999

(51) Int. Cl.⁷ .................................................. H01L 21/44
(52) U.S. Cl. .................... 438/622; 438/626; 438/634; 438/640; 438/740
(58) Field of Search .................... 438/622, 626, 438/634, 640, 740

(56) References Cited

U.S. PATENT DOCUMENTS 5,635,423 * 6/1997 Huang et al. ..................... 437/195
5,877,076 * 3/1999 Dai ..................................... 438/597

\* cited by examiner

*Primary Examiner*—Charles Bowers
*Assistant Examiner*—Lisa Kilday
(74) *Attorney, Agent, or Firm*—Anthony Grillo

(57) ABSTRACT

A process for forming a dual damascene structure. The process includes forming a stack including insulating layers and a stop layer where two masks are formed above the stack. One of the masks is used to form via or contact openings in the insulating layers and the second mask is used to form grooves for interconnections in the insulating layers. In an alternative embodiment, the grooves are formed before the via or contact openings.

18 Claims, 3 Drawing Sheets

PROCESS FOR MANUFACTURING AN INTEGRATED CIRCUIT INCLUDING A DUAL-DAMASCENE STRUCTURE AND AN INTEGRATED CIRCUIT

CROSS REFERENCED APPLICATIONS

The present invention is related to patent application Ser. No. 09/386,065, entitled A PROCESS FOR MANUFACTURING AN INTEGRATED CIRCUIT INCLUDING A DUAL-DAMASCENE STRUCTURE AND AN INTEGRATED CIRCUIT filed on Aug. 30, 1999.

FIELD OF THE INVENTION

The present invention relates generally to integrated circuits and, more particularly, to a process for forming dual damascene structures in an integrated circuit.

BACKGROUND OF THE INVENTION

Single damascene is an interconnection fabrication process for integrated circuits in which grooves are formed in an insulating layer and filled with a conductive material to form interconnects. Dual damascene is a multi-level interconnection process in which, in addition to forming the grooves of single damascene, conductive contact (or via) openings are also formed in the insulating layer. A conductive material is formed in the grooves and conductive contact (or via) openings.

In one standard dual damascene process, a first oxide layer is deposited over a conductive structure. A hard mask is formed over the first oxide layer and a first patterned photoresist layer is formed on the hard mask. The hard mask is patterned using the first photoresist layer as a pattern. The first photoresist layer is removed and a second oxide layer is then formed over the hard mask.

A second patterned photoresist layer is formed over the second oxide layer. Both the first oxide layer and the second oxide layer are etched to form the dual damascene opening. The first oxide layer is etched using the hard mask as a pattern and the underlying conductive structure as an etch stop. The second oxide layer is etched using the second photoresist layer as a pattern and the hard mask as an etch stop. The second photoresist layer is then stripped.

This process involves a combination of different steps to form the dual damascene structure. For example, the hardmask is patterned prior to forming the second dielectric layer. Thus, the partially fabricated integrated circuit is transferred between different processing systems to perform the different deposition and patterning steps.

In another dual damascene process, a dielectric is formed and patterned using a first photoresist. The first photoresist is removed and the dielectric is patterned again using a second photoresist. The vias and grooves are formed using the different patterning steps. This process uses a timed etch to control the depth of the grooves. This process is difficult to control. Thus, it is desirable to develop a process that reduces the complexity of the process to form a dual damascene structure.

SUMMARY OF THE INVENTION

The present invention is directed to a process for forming a dual damascene structure. The process includes forming a stack including insulating layers and a stop layer where two masks are formed above the stack. One of the masks is used to form via or contact openings in the insulating layers and the second mask is used to form grooves for interconnections in the insulating layers. In one alternative embodiment, the grooves are formed before the via or contact openings.

By using the two mask layers after the stack is formed, the number of processing steps and movement of the partially fabricated integrated circuit between systems may be reduced. In other words, the insulating layers and the etch stop may be formed and then subsequently patterned to form the dual damascene structure. Further, the insulating layer and the etch stop layer may be formed in the same chamber or cluster of chambers. Further, at least one resist strip process may be avoided.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

The illustrative embodiment of the present invention is directed to a process for forming a dual damascene structure. The process includes forming a stack including insulating layers and a stop layer where two masks are formed above the stack. One of the masks is used to form via or contact openings in the insulating layers and the second mask is used to form grooves for interconnections in the insulating layers. In an alternative embodiment, the grooves are formed before the via or contact openings.

By using the two mask layers after the stack is formed, the number of processing steps and movement of the partially fabricated integrated circuit between systems may be reduced. In other words, the insulating layers and the etch stop may be formed and then subsequently patterned to form the dual damascene structure. Further, the insulating layer and the etch stop layer may be formed in the same chamber or cluster of chambers. Further, at least one resist strip process may be avoided.

Figure 1:
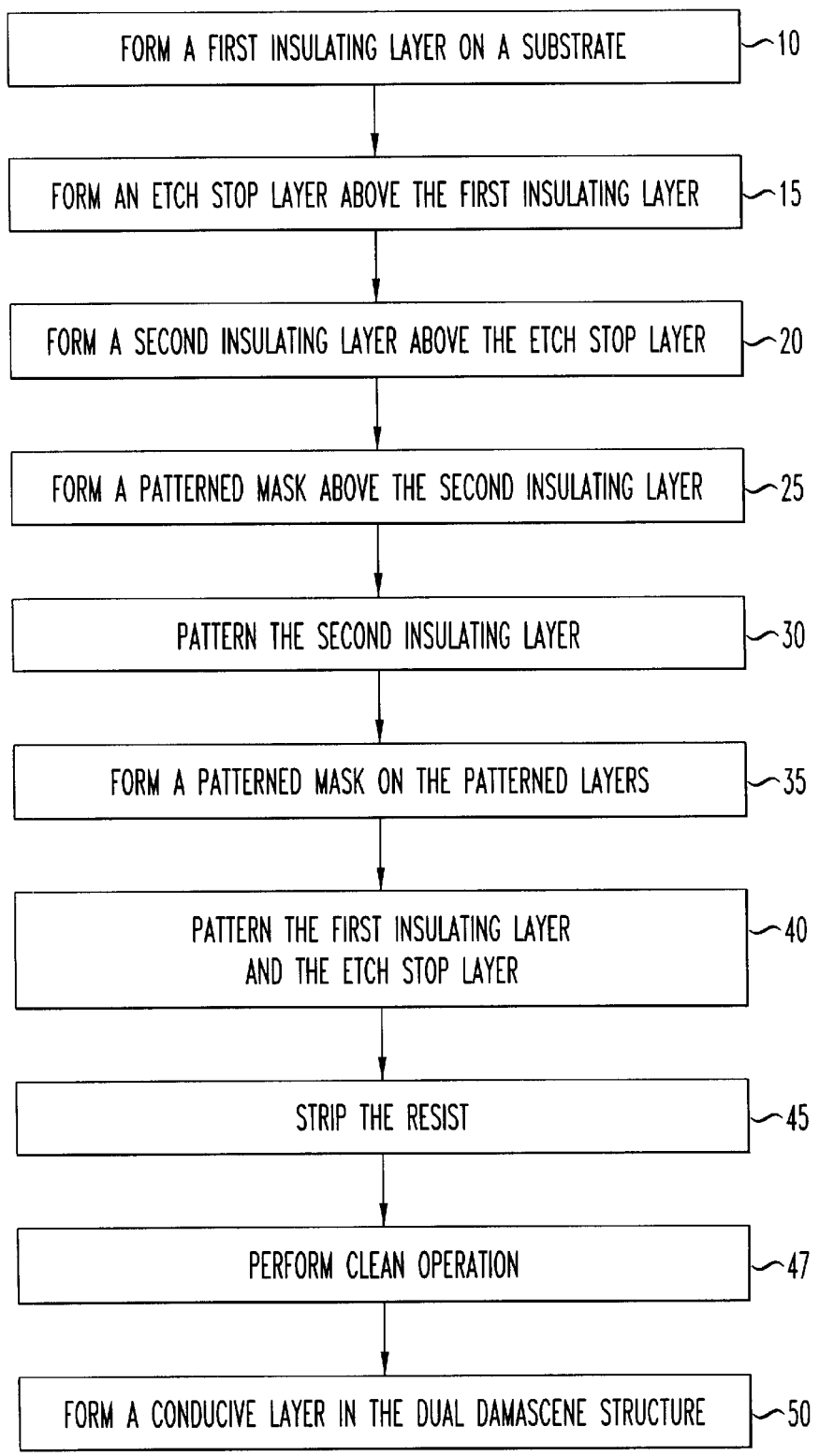
FIG. 1 is a flowchart diagram illustrating the process for manufacturing an integrated circuit according to an illustrative embodiment of the present invention.
Figure 2:
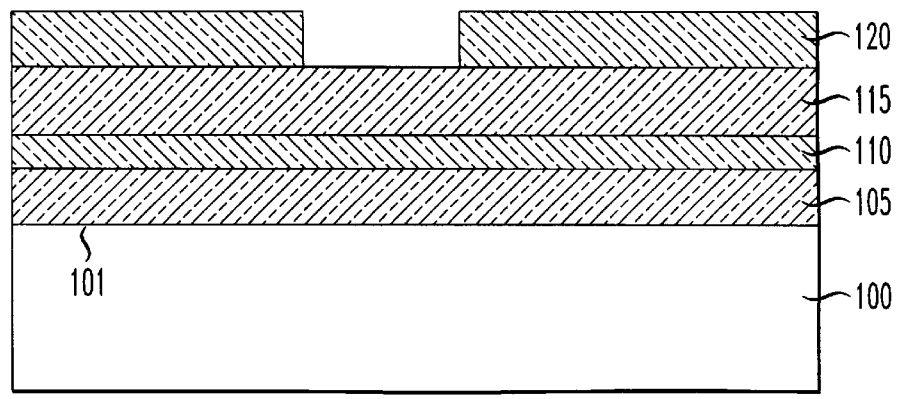
FIGS. 2–7 are schematic diagrams of an integrated circuit during successive stages of manufacture using the process of FIG. 1.
Figure 3:
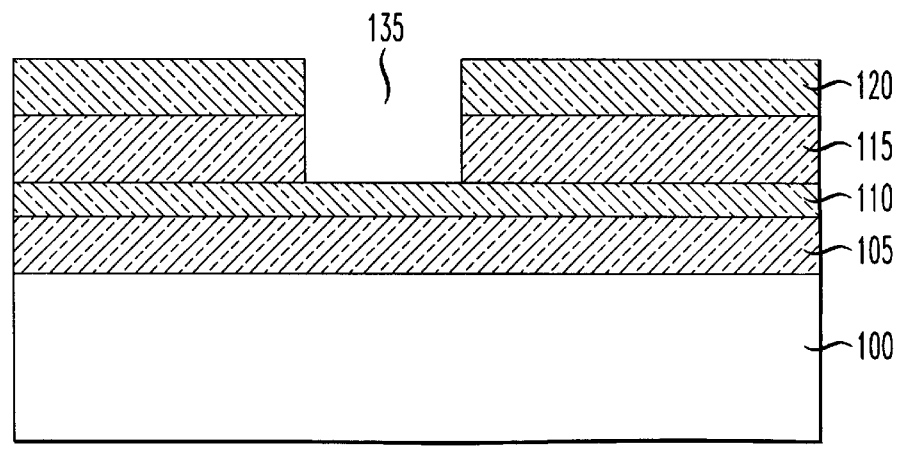
Figure 4:
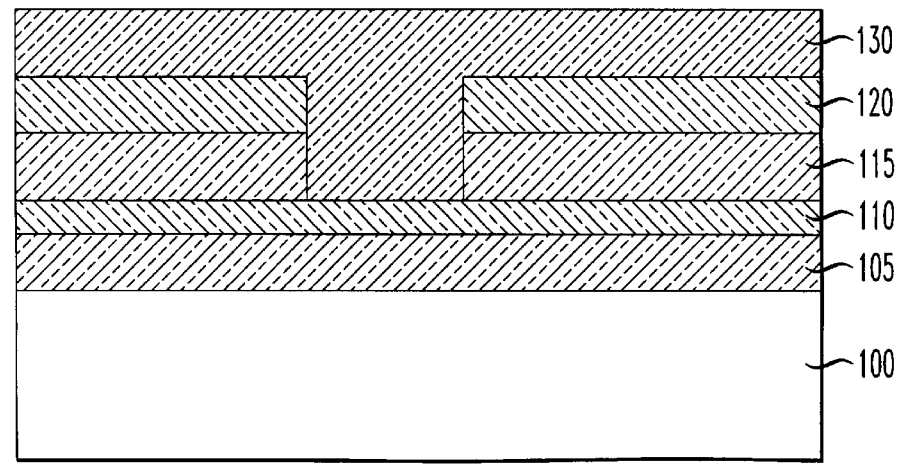
Figure 5:
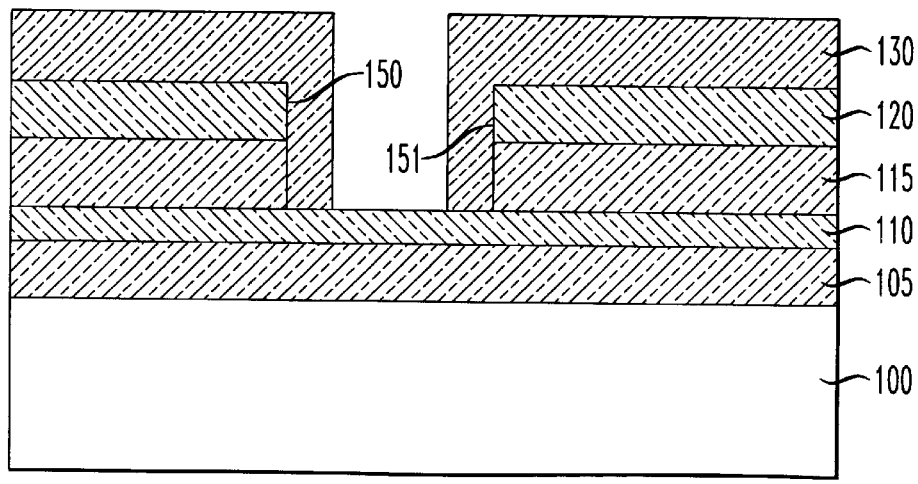
Figure 6:
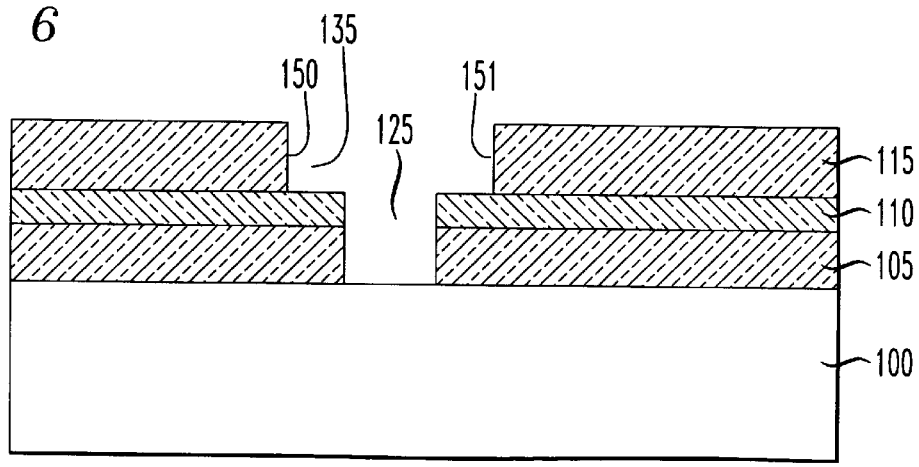

Referring now to the drawing, wherein like reference numerals refer to like elements throughout, FIG. 1 is a flow chart diagram illustrating an exemplary embodiment of the present invention. FIGS. 2–7 are schematic diagrams illustrating the successive stages of manufacture of an integrated circuit according to the flow chart shown in FIG. 1.

At step 10, a first insulating layer 105 is formed on a substrate 100. The first insulating layer 105 is, for example, a dielectric such as a high-density deposited silicon oxide (e.g., $SiO_2$). Alternatively, the first insulating layer may be a borophosphosilicate glass, a phosphosilicate glass, a glass formed from phosphorous and/or boron-doped tetraethyl orthosilicate, spin-on glass, xerogels, aerogels or other low dielectric constant films such as polymer, fluorinated oxide and hydrogen silsesquioxane.

The substrate 100 is, for example, a semiconductor such as silicon or compound semiconductor such as GaAs or SiGe. Alternatively, the substrate 100 may be an intermediate layer in an integrated circuit such as a dielectric, conductor, or other material. In addition, the upper surface 101 of the substrate 100 may not be planar. In this case, the first insulating layer 105 may be planarized using, for example, chemical mechanical polishing (CMP) as is well known.

At step 15, an etch stop layer 110 is formed above or in direct contact with the first insulating layer 105. In an alternative embodiment, one or more layers may be formed between the etch stop layer 110 and the first insulating layer 105. The material for the etch stop layer may be selected to be more etch resistant than the second insulating layer 115 for a selected etchant. In other words, the etch stop layer 110 etches at a slower rate than the second insulating layer 105 when exposed to a selected etchant. For example, the etch stop layer may be TiN where the second insulating is $SiO_2$. Further, the etch stop layer may be Ta/TaN, $Si_3N_4$, a silicon-rich oxide, or a multi-layered $SiO_2$ dielectric.

At step 20, a second insulating layer 115 is formed above or in direct contact with the etch stop layer 115. The second layer 115 may be formed using the same materials and processes used to form the first insulating layer 105. At step 25, a first patterned mask 120 is formed above or on the insulating layer 115. The first patterned mask 120 includes openings that correspond to the runners to be formed.

At step 30, grooves are opened in the second insulating layer 115. The grooves 135 may be formed using conventional etching techniques. During etching, the etch stop layer 110 is used to define the endpoint for this etching process.

Ilustratively, the grooves 135 are formed by: 1) applying a layer of resist material (the first patterned mask 120) on the second insulating layer 115; 2) exposing the resist material to an energy source which passes through a reticle; 3) removing areas of resist to form the pattern in the resist; and 4) etching the grooves 135. The energy source may be an e-beam, light source, or other suitable energy source.

Subsequently, at step 35, a second patterned mask 130 is formed above or on the first patterned mask 120. The second patterned mask is formed so that the openings in this mask correspond to the via or contact openings (hereinafter "openings") to be formed. A portion of the second patterned mask may be formed on the walls 150, 151 of the grooves 135. As a result, the walls 150, 151 may not be further etched during the formation of the openings.

Illustratively, the second patterned mask 130 is formed by: 1) applying a layer of resist material in the grooves 135 and on the first patterned mask 120; 2) exposing the resist material to an energy source which passes through a reticle; and 3) removing areas of resist to form the pattern in the resist. The energy source may be an e-beam, light source, or other suitable energy source.

At step 40, the etch stop layer 110 and the first insulating layer 105 are patterned to form openings 125 corresponding to the interconnects between layers to be formed. The openings 125 may be formed using conventional etching techniques or a combination of techniques to etch through at least the two different layers.

The openings 125 are contained or at least partially contained within boundaries defined by the walls 150, 151 of the grooves 135. Then, at step 45, the remaining portions of the mask layers 120, 130 are stripped using well-known techniques and the partially completed integrated circuit is cleaned at step 47 using conventional processes.

At step 50, a conductive layer 145 is blanket deposited above the second insulating layer 115 and in the openings and grooves. Then, the portions of the conductive layer outside the grooves 135 and on or above the second insulating layer 115 are removed to complete the interconnect. This may be accomplished using a conventional chemical mechanical polishing process. The conductive layer 145 is a conducting material such as tungsten, aluminum, copper, nickel, polysilicon, or other conducting material suitable for use as a conductor as is known to those skilled in this art.

Figure 7:
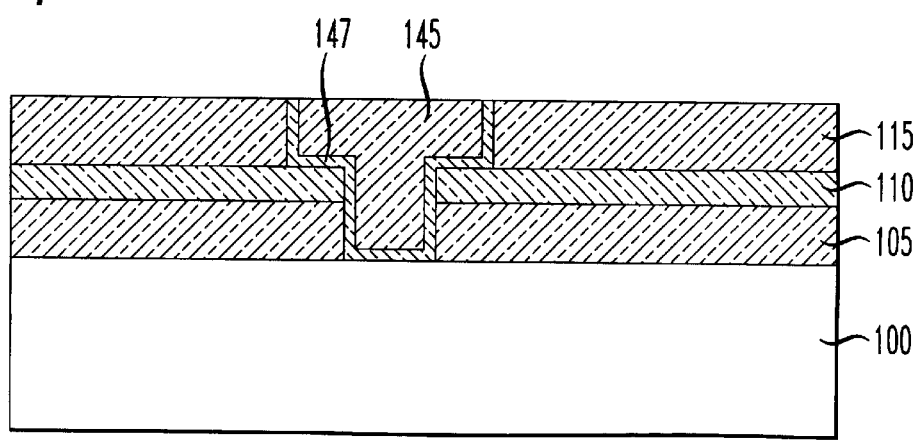

In an alternative embodiment, one of more layers may be formed prior to the deposition of the conductive layer 145. These layers may be barrier layers preventing the migration of moisture and contaminants between the conductive layer and the surrounding layers. An exemplary barrier layer 147 is shown in FIG. 7. For example, if the conductive layer 145 is copper, a barrier layer 147 including layers of Ta and TaN may be deposited on the second insulating layer 120 and in the openings and grooves prior to the deposition of the conductive layer. Where the conductive layer 145 includes Al, a barrier layer 147 including layers of (1) Ti and TiN or (2) Ti and TiN and Ti may be used.

In addition, a capping layer, such as $Si_3N_4$, TaN, TiN, or TiW may be formed on the upper surface of the conductive layer. Other materials for the barrier layer include WSi, TiW, Ta, TaN, Ti, TiN, Cr, Cu, Au, WN, TaSiN, or WSiN. The barrier layer 147 may also function as an adhesion layer and/or a nucleation layer for the subsequently formed conductive layer.

Subsequently, the integrated circuit is completed by adding, if necessary, additional metal levels that may including interconnects formed using the process above and conventional processes to complete an integrated circuit. The integrated circuit also includes transistors and other components necessary for a particular integrated circuit design. The processes for manufacturing an integrated circuit including these structures are described in 1–3 Wolf, *Silicon Processing for the VLSI Era*, (1986), which is incorporated herein by reference.

Although the invention has been described with reference to exemplary embodiments, it is not limited to those embodiments. Rather, the appended claims should be construed to include other variants and embodiments of the invention that may be made by those skilled in the art without departing from the true spirit and scope of the present invention.

What is claimed:

1. A method for manufacturing an integrated circuit comprising:
   (a) providing a stack of layers having a first layer, a second layer, and a stop layer;
   (b) forming a first mask layer above the stack of layers;
   (c) forming a first opening having a base in one of the first layer and the second layer;
   (d) forming a second mask layer above the first mask layer;
   (e) forming a second opening smaller than the first opening in at least two of the first layer, the second layer, and the stop layer; the second opening formed at least in a portion of the base.

2. The method of claim 1 wherein step (c) is performed prior to step (e).

3. The method of claim 1 wherein the first opening is a groove and the second opening is one of a via or contact opening.

4. The method of claim 1 further comprising forming the stop layer between the first layer and the second layer to form the stack.

5. The method of claim 4 wherein step (e) further comprises forming the second opening in the stop layer and the first layer.

6. The method of claim 5 wherein step (c) further comprises forming the first opening in the second layer.

7. The method of claim 5 further comprising exposing a surface of the stop layer to form the base.

8. An integrated circuit formed according to the process of claim 1.

9. The method of claim 1 wherein step (c) further comprises forming a first mask layer and step (e) further comprises forming a second mask layer above the first mask layer.

10. The method of claim 9 wherein step (c) further comprises using the first mask layer to form the first opening and step (e) further comprises using the second mask layer to form the second opening.

11. The method of claim 9 wherein the first opening is a groove and the second opening is one of a via and contact opening.

12. The method of claim 1 wherein the first opening is a groove and the second opening is one of a via and contact opening.

13. The method of claim 1 wherein the stop layer is a hardmask.

14. The method of claim 1 wherein the stop layer is selected from the group consisting of Ta, TaN, $Si_3N_4$, a silicon-rich oxide, and a multi-layered $SiO_2$ dielectric.

15. The method of claim 1 wherein the first layer and the second layer are a dielectric.

16. The method according to claim 15 wherein the dielectric is selected from the group consisting of Ta, TaN, $Si_3N_4$, a silicon-rich oxide, and a multi-layered $SiO_2$ dielectric.

17. The method of claim 1 further comprising forming a conductive material in the first opening and the second opening to form interconnects in the integrated circuit.

18. The method of claim 17 wherein the conductive material is selected from the group consisting of Cu, Al, W, Ni, polysilicon, and Au.

* * * * *